(12) United States Patent
Park et al.

(10) Patent No.: US 9,406,905 B2
(45) Date of Patent: Aug. 2, 2016

(54) ORGANIC LIGHT-EMITTING DISPLAY APPARATUS HAVING A FLEXIBLE SUBSTRATE

(71) Applicant: SAMSUNG DISPLAY CO., LTD., Yongin, Gyeonggi-Do (KR)

(72) Inventors: Yong-Hwan Park, Yongin (KR); Jae-Seob Lee, Yongin (KR); Yong-Kwan Kim, Yongin (KR); Chung Yi, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/213,678

(22) Filed: Mar. 14, 2014

(65) Prior Publication Data

US 2014/0346473 A1    Nov. 27, 2014

(30) Foreign Application Priority Data

May 24, 2013 (KR) .................. 10-2013-0059260

(51) Int. Cl.
*H01J 1/62* (2006.01)
*H01L 51/52* (2006.01)
*H01L 51/00* (2006.01)
*H01L 51/56* (2006.01)
*H01L 27/32* (2006.01)

(52) U.S. Cl.
CPC ........ *H01L 51/5256* (2013.01); *H01L 51/0097* (2013.01); *H01L 51/5253* (2013.01); *H01L 51/56* (2013.01); *H01L 27/3244* (2013.01); *H01L 2251/5338* (2013.01); *Y02E 10/549* (2013.01); *Y02P 70/521* (2015.11)

(58) Field of Classification Search
None
See application file for complete search history.

(56) References Cited

U.S. PATENT DOCUMENTS

| 5,811,177 A * | 9/1998 | Shi ...................... H01L 51/5237 257/100 |
| 2002/0140347 A1 | 10/2002 | Weaver |
| 2005/0116637 A1 | 6/2005 | Yoshizawa |
| 2005/0202646 A1 | 9/2005 | Burrows et al. |
| 2005/0242720 A1* | 11/2005 | Sano .................. H01L 51/5237 313/506 |
| 2010/0151366 A1* | 6/2010 | Nukada ................ G03G 5/0614 430/56 |
| 2011/0156062 A1 | 6/2011 | Kim et al. |

FOREIGN PATENT DOCUMENTS

| EP | 2 091 096 | 8/2009 |
| JP | 2003-086352 | 3/2003 |

(Continued)

OTHER PUBLICATIONS

Extended European Search Report Dated Oct. 10, 2014.

(Continued)

*Primary Examiner* — Pamela E Perkins
(74) *Attorney, Agent, or Firm* — F. Chau & Associates, LLC

(57) ABSTRACT

An organic light-emitting display apparatus includes a flexible substrate. The organic light-emitting display apparatus includes a first plastic layer. A first barrier layer is formed on the first plastic layer. A second plastic layer is formed on the first barrier layer. An organic light-emitting device layer is formed on the second plastic layer. A thin film encapsulating layer encapsulates the organic light-emitting device layer. The first barrier layer is patterned to correspond to an area where the organic light-emitting device layer is formed.

13 Claims, 10 Drawing Sheets

(56) References Cited

FOREIGN PATENT DOCUMENTS

| | | |
|---|---|---|
| KR | 10-2008-0073942 | 8/2008 |
| KR | 10-2011-0026318 | 3/2011 |
| KR | 10-2011-0074284 | 6/2011 |
| KR | 10-2011-0133881 | 12/2011 |
| KR | 10-2012-0078126 | 7/2012 |
| WO | WO 2005050754 | 6/2005 |

OTHER PUBLICATIONS

U.S. Pat. No. US 2011/0156062 (FOR KR 2011-0074284).

* cited by examiner

ORGANIC LIGHT-EMITTING DISPLAY APPARATUS HAVING A FLEXIBLE SUBSTRATE

CROSS-REFERENCE TO RELATED PATENT APPLICATION

This application claims priority to Korean Patent Application No. 10-2013-0059260, filed on May 24, 2013, in the Korean Intellectual Property Office, the disclosure of which is herein incorporated by reference in its entirety.

TECHNICAL FIELD

The present invention relates to an organic light-emitting display apparatus, and more particularly, to an organic light-emitting display apparatus including a flexible substrate.

DISCUSSION OF THE RELATED ART

An organic light-emitting display apparatus generally includes a hole injection electrode, an electron injection electrode, and an organic light-emitting layer formed there between. The organic light-emitting display apparatus is a self light-emitting display apparatus that emits light when holes injected from the hole injection electrode and electrons injected from the electron injection electrode recombine within the organic light-emitting layer giving rise to an excited state that gradually dissipates thereafter.

Because of its high quality characteristics such as low power consumption, high brightness, and fast response speed, the organic light-emitting display apparatus has received attention as a next generation display.

When the organic light-emitting display apparatus includes a heavy and fragile glass substrate, characteristics such as portability and large size of the screen display are limited. Therefore, a flexible organic light-emitting display apparatus including a light and shock-resistant flexible substrate such as a plastic substrate has been developed recently.

However, when compared to a glass substrate, since a flexible substrate such as a plastic substrate transmits moisture or oxygen more easily, the organic light-emitting layer may be left vulnerable to moisture or oxygen and degradation may occur.

SUMMARY OF THE INVENTION

The present invention provides an organic light-emitting display apparatus including a flexible substrate with a low water vapor transmission rate and increased adhesive strength, and a method of manufacturing the organic light-emitting display apparatus.

According to an aspect of the present invention, an organic light-emitting display apparatus includes a first plastic layer. A first barrier layer is formed on the first plastic layer. A second plastic layer is formed on the first barrier layer. An organic light-emitting device layer is formed on the second plastic layer. A thin film encapsulating layer encapsulates the organic light-emitting device layer. The first barrier layer is located in correspondence to an area where the organic light-emitting device layer is formed.

The first plastic layer and the second plastic layer may directly contact an outer part of an area where the organic light-emitting device layer is formed.

The organic light-emitting display apparatus may further include a second barrier layer disposed between the second plastic layer and the organic light-emitting device layer.

The second barrier layer may include at least one layer including an inorganic material.

The second barrier layer may be located in an area where the organic light-emitting device layer is formed.

The second barrier layer and the thin film encapsulating layer may directly contact an outer part of an area where the organic light-emitting device layer is formed.

At least one pair of layers, each layer including a third plastic layer and a third barrier layer, may be formed between the second barrier layer and the organic light-emitting device layer.

The second barrier layer may be located in an area where the organic light-emitting device layer is formed.

The first plastic layer and the second plastic layer may include polyiminde, polyethylene naphthalate, polyethyleneterephthalate, polyarylate, polycarbonate, polyethersulfone, or polyetherimide.

The second plastic layer may be thicker than the first plastic layer.

The second plastic layer may have a lower viscosity than the first plastic layer.

The first barrier layer may include at least one layer including an inorganic material.

According to an aspect of the present invention, an electronic device includes the organic light-emitting display apparatus.

According to an aspect of the present invention, a method of manufacturing an organic light-emitting display apparatus includes preparing a carrier substrate. A mother flexible substrate is formed on the carrier substrate, the mother flexible substrate including a first plastic layer, a first barrier layer patterned with an island type, and a second plastic layer, which are sequentially stacked. A plurality of organic light-emitting device layers are formed at a position corresponding to an area where the patterned first barrier layer on the mother flexible substrate is located. A thin film encapsulating layer encapsulating the plurality of organic light-emitting device layers is formed. The carrier substrate is separated from the mother flexible substrate.

The separating of the carrier substrate from the mother flexible substrate may include radiating a laser beam from an opposite direction of a side where the mother flexible substrate of the carrier substrate is formed to separate the carrier substrate from the mother flexible substrate.

The laser beam may be an ultraviolet (UV) light.

The forming of the mother flexible substrate may further include forming a second barrier layer between the second plastic layer and the organic light-emitting device layers.

The forming of the mother flexible substrate may further include forming at least one pair of structures between the second barrier layer and the organic light-emitting device layers, each structure including a third plastic layer and a third barrier.

The second barrier layer may be patterned to correspond to the first barrier layer.

The forming of the mother flexible substrate may further include forming at least one pair of structures between the second barrier layer and the organic light-emitting device layers, each structure may include a third plastic layer and a third barrier layer.

The forming of the mother flexible substrate may include forming the second plastic layer to be identical in size or smaller than the first plastic layer.

An end part of the second plastic layer and an end part of the first barrier layer may directly contact an end part of the carrier substrate.

The forming of the mother flexible substrate may include forming the second plastic layer to have a lower viscosity than the first plastic layer.

The forming of the mother flexible substrate may include forming the second plastic layer to be thicker than the first plastic layer.

A glass substrate may be used as the carrier substrate.

The method may further include dividing the organic light-emitting device layers on the mother flexible substrate into a plurality of unit display devices after the separating of the carrier substrate from the mother flexible substrate.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION OF THE INVENTION

Figure 1:
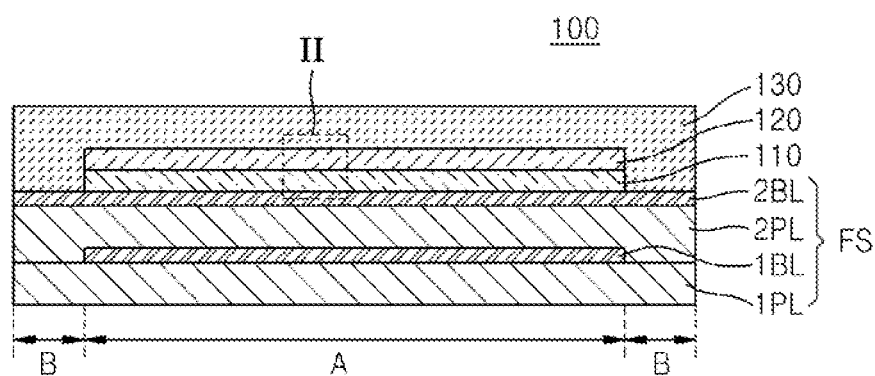
FIG. 1 is a cross-sectional view illustrating an organic light-emitting display apparatus according to an exemplary embodiment of the present invention.

Hereinafter, embodiments of the present invention will be described in more detail with reference to the accompanying drawings. The present invention may be realized in different forms, and is not limited to the embodiments described herein.

Like reference numerals may refer to like elements throughout the specification and figures. In addition, the size and thickness of each element shown in the drawings may be exaggerated for clarity.

In this specification, when a portion of a layer, a film, a region, and a plate is referred to as being "on" another portion, it can be directly on the other portion, or intervening portions may also be present.

FIG. 1 is a cross-sectional view illustrating an organic light-emitting display apparatus according to an exemplary embodiment of the present invention.

Referring to FIG. 1, the organic light-emitting display apparatus 100 according to an exemplary embodiment of the present invention includes a flexible substrate FS, a thin film transistor (TFT) layer 110, an organic light-emitting device layer 120, and a thin film encapsulating layer 130.

The flexible substrate FS includes a first plastic layer 1PL, a first barrier layer 1BL, a second plastic layer 2PL, and a second barrier layer 2BL.

The first plastic layer 1PL and the second plastic layer 2PL may be formed of a plastic material with excellent heat resistance and durability, for example, polyiminde, polyethylene naphthalate, polyethyleneterephthalate (PET), Polyarylate, polycarbonate, Polyetherimide (PEI), or Polyethersulfone.

Since the plastic material for the first plastic layer 1PL and the second plastic layer 2PL transmits moisture or oxygen easily when compared to a glass substrate, an organic light-emitting layer vulnerable to moisture or oxygen is easily deteriorated, so that the lifecycle of the organic light-emitting display apparatus is reduced.

In order to prevent this, the first barrier layer 1BL is formed on the first plastic layer 1PL, and the second barrier layer 2BL is formed on the second plastic layer 2PL.

Each of the first barrier layer 1BL and the second barrier layer 2BL may be formed of an inorganic material, for example, metal oxide, silicon nitride, or silicon oxide. For example, each of the first barrier layer 1BL and the second barrier layer 2BL may include a single layer or a multilayer formed of an inorganic material such as AlO3, SiO2, and SiNx. Each of the first barrier layer 1BL and the second barrier layer 2BL formed of a single layer or a multilayer may have a water vapor transmission rate (WVTR) of less than about 10 g/m$^2$day to about 5 g/m$^2$day.

In the first embodiment, the first barrier layer 1BL is patterned to have an island shape. For example, the first barrier layer 1BL is patterned to be located in an area A corresponding to the organic light-emitting device layer 120. The first plastic layer 1PL and the second plastic layer 2PL are in direct contact in a peripheral area B of the area A corresponding to the organic light-emitting device layer 120. As described herein, the patterned first barrier layer 1BL may prevent the delamination between the first barrier layer 1BL and the second plastic layer 2PL.

The TFT layer 110 and the organic light-emitting device layer 120 are formed on the flexible substrate FS.

Figure 2:
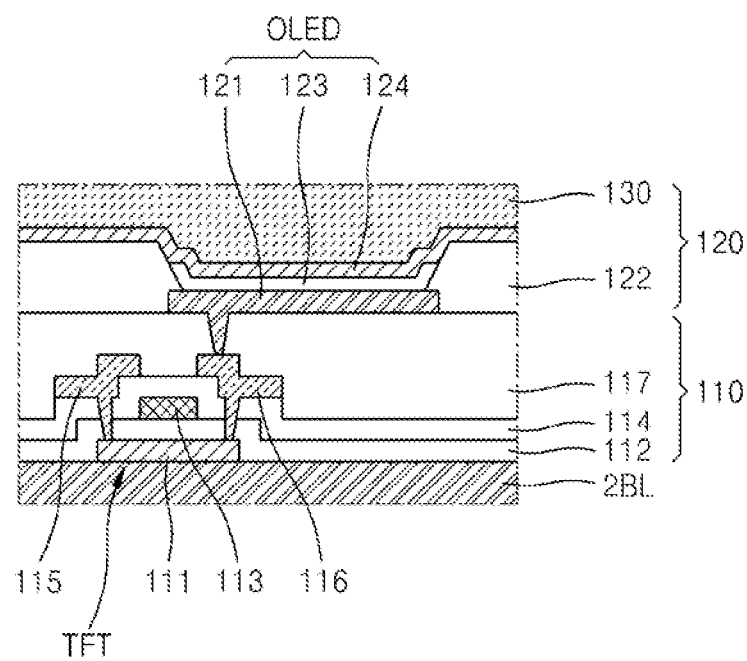
FIG. 2 is an enlarged view of a portion II of FIG. 1, illustrating a portion of a TFT layer and an organic light-emitting device layer of an organic light-emitting display apparatus.

FIG. 2 is an enlarged view of a portion II of FIG. 1, for example, a portion of the TFT layer 110 and the organic light-emitting device layer 120 of the organic light-emitting display apparatus 100.

Referring to FIG. 2, a TFT including a semiconductor layer 111, a gate electrode 113, a source electrode 115, and a drain electrode 116 may be formed on the second barrier layer 2BL. A gate insulating layer 112 may be formed between the semiconductor layer 111 and the gate electrode 113, and an interlayer insulating layer 114 may be formed between the gate electrode 113 and the source electrode 115 and between the gate electrode 113 and the drain electrode 116. The semiconductor layer 111 may be a poly-silicon TFT, an amorphous silicon TFT, an organic TFT, or a conductive oxide TFT. Moreover, although a top gate TFT is shown in FIG. 2, the present invention is not limited thereto. For example, various structures of TFTs including a bottom gate TFT may be applicable.

Moreover, although a TFT is directly formed on the second barrier layer 2BL as shown in FIG. 2, the present invention is not limited thereto. A buffer layer (not shown) may be further provided between the second barrier layer 2BL and the TFT. The buffer layer (not shown) flattens the flexible substrate FS and prevents impurity elements from penetrating from the flexible substrate FS into the semiconductor layer 111. The buffer layer (not shown) may be a single layer or a multilayer of silicon nitride and/or silicon oxide. Moreover, although not shown in FIG. 2, at least one capacitor may be connected to the TFT.

A passivation layer 117 may be formed on the TFT and a pixel definition layer 122 may be formed on the passivation layer 117. The passivation layer 117 protects the TFT and flattens a top side of the TFT.

An organic light-emitting device OLED may be connected to one of the source electrode 115 and the drain electrode 116 of the TFT. The organic light-emitting device OLED includes a pixel electrode 121, an opposite electrode 124, and a layer 123 including at least an organic light-emitting layer interposed between the pixel electrode 121 and the opposite electrode 124. The layer 123 including an organic light-emitting layer may be formed of a low molecular or polymer organic matter. When a low molecular organic matter is used, a hole injection layer (HIL), a hole transport layer (HTL), an emission layer (EML), an electron transport layer (ETL), and an electron injection layer (EIL) may be stacked in a single or complex structure. When a polymer organic matter is used, a structure including an HTL and an EML may be provided. In the layer 123 including an organic light-emitting layer, sub pixels emitting red, green, and blue light may form one unit pixel. Moreover, the layer 123 including an organic light-emitting layer is formed by vertically stacking or mixing layers including light-emitting materials emitting red, green, and blue light. Where white light is emitted, a combination of other colors is possible. Additionally, a color conversion layer or a color filter converting the emitted white light into a predetermined color may be provided further.

The opposite electrode 124 may be commonly formed in a plurality of pixels. For example, various modifications are possible.

The pixel electrode 121 may function as an anode and the opposite electrode 124 may function as a cathode. However, the opposite may be possible too. Additionally, at least one of the pixel electrode 121 and the opposite electrode 124 may be provided as a transparent electrode through which a light emitted from a light-emitting layer passes.

Although the organic light-emitting device layer 120 is formed on the TFT layer 100 as shown in FIGS. 1 and 2, this is for concise description and other arrangements may be used. For example, a portion of the TFT layer 110 and the organic light-emitting device layer 120 may be formed on the same layer. For example, the gate electrode of the TFT and the pixel electrode of the organic light-emitting device OLED may be formed on the same layer.

The thin film encapsulating layer 130 encapsulating the organic light-emitting device OLED is formed on the flexible substrate FS. The thin film encapsulating layer 130 may be formed of a plurality of inorganic layers or a mixture of an inorganic layer and an organic layer.

The organic layer is formed of polymer, and may be a single layer or a stacked layer formed of one of polyethyleneterephthalate, polyimide, polycarbonate, epoxy, polyethylene, and polyacrylate. For example, the organic layer may be formed of polyacrylate. In more detail, the organic layer may include a polymerized monomer composition including diacrylate based monomer and triacrylate based monomer. The monomer composition may further include monoacrylate based monomer. Moreover, the monomer composition may further include a well-known photo initiator such as TPO but is not limited thereto.

The inorganic layer may be a single layer or a stacked layer including metal oxide or metal nitride. In more detail, the organic layer may include $SiN_x$, $Al_2O_3$, $SiO_2$, or $TiO_2$.

The uppermost layer exposed to the outside in the thin film encapsulating layer 130 may be formed of an inorganic layer to prevent water and vapor transmission with respect to the organic light-emitting device OLED.

The thin film encapsulating layer 130 may include at least one sandwich structure in which at least one organic layer is inserted between at least two inorganic layers. Additionally, the thin film encapsulating layer 130 may include at least one sandwich structure in which at least one inorganic layer is inserted between at least two organic layers.

The thin film encapsulating layer 130 may include a first inorganic layer, a first organic layer, and a second inorganic layer, which are sequentially stacked on the organic light-emitting device OLED. Moreover, the thin film encapsulating layer 130 may include a first inorganic layer, a first organic layer, a second inorganic layer, a second organic layer, and a third inorganic layer, which are sequentially stacked on the organic light-emitting device OLED. Moreover, the thin film encapsulating layer 130 may include a first inorganic layer, a first organic layer, a second inorganic layer, a second organic layer, a third inorganic layer, a third organic layer, and a fourth inorganic layer, which are sequentially stacked on the organic light-emitting device OLED.

A halogenated metal layer including LiF may be additionally included between the organic light-emitting device OLED and the first inorganic layer. The halogenated metal layer may prevent the organic light-emitting device OLED from being damaged when the first inorganic layer is formed through a sputtering method or a plasma deposition method.

The first organic layer may have a narrower area than the second inorganic layer, and the second organic layer may have a narrower area than the third inorganic layer. Additionally, the first organic layer may be completely covered by the second inorganic layer. The second organic layer may be completely covered by the third inorganic layer.

Moreover, although the thin film encapsulating layer 130 is directly formed on the opposite electrode 124 as shown in FIGS. 1 and 2, this is just exemplary. Thus, other components such as fillers and adhesives may be further interposed between the opposite electrode 124 and the thin film encapsulating layer 130.

Figure 3:
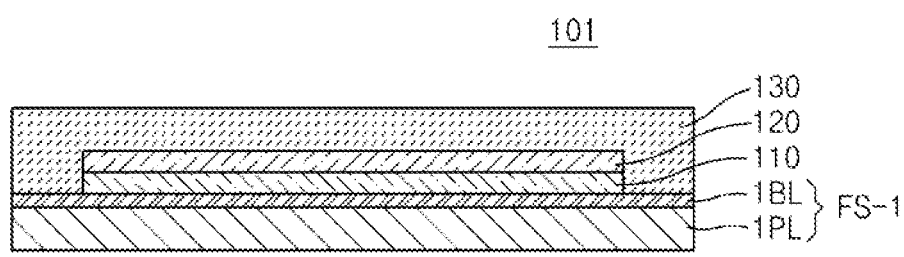
FIG. 3 is a cross-sectional view illustrating an organic light-emitting display apparatus according to a comparative example of the present invention.

FIG. 3 is a cross-sectional view illustrating an organic light-emitting display apparatus 101 according to a comparative example of the present invention.

Referring to FIG. 3, the organic light-emitting display apparatus 101 according to a comparative example of the present invention includes a flexible substrate FS-1, a TFT layer 110, an organic light-emitting device layer 120, and a thin film encapsulating layer 130.

The flexible substrate FS-1 includes a first plastic layer 1PL and a first barrier layer 1BL. For example, the flexible substrate FS-1 includes a single plastic layer and a single barrier layer.

When the flexible substrate FS-1 includes the single plastic layer and the single barrier layer like in the first comparative example, damages such as cracks occur in the first barrier layer 1BL due to foreign materials or dent defects in the first plastic layer IPL and/or the first barrier layer 1BL. Since moisture or oxygen is transmitted through such a damaged surface, defective organic light-emitting device OLEDs may be manufactured.

Figure 4:
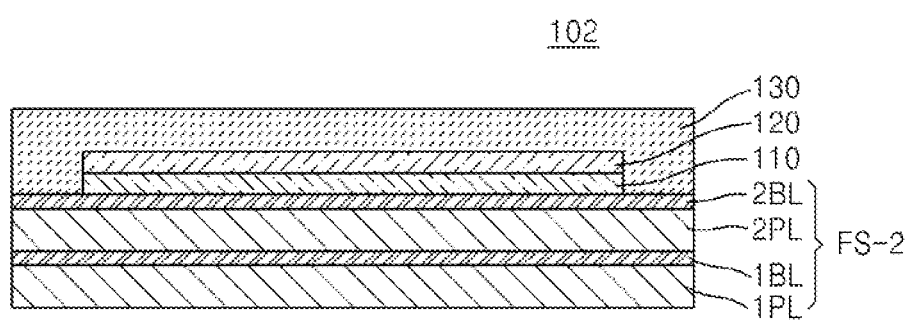
FIG. 4 is a cross-sectional view illustrating an organic light-emitting display apparatus according to a comparative example of the present invention.

FIG. 4 is a cross-sectional view illustrating an organic light-emitting display apparatus 102 according to a comparative example of the present invention.

Referring to FIG. 4, the organic light-emitting display apparatus 102 according to a comparative example of the present invention includes a flexible substrate FS-2, a TFT layer 110, an organic light-emitting device layer 120, and a thin film encapsulating layer 130.

The flexible substrate FS-2 includes a first plastic layer 1PL, a first barrier layer 1BL, a second plastic layer 2PL, and a second barrier layer 2BL. For example, the flexible substrate FS-2 includes two structures, each including a plastic layer and a barrier layer on the plastic layer.

Foreign materials or dent defects may randomly occur in the second plastic layer 2PL and the second barrier layer 2BL in addition to the first plastic layer 1PL and the first barrier layer 1BL. However, when compared to the first comparative example, since the organic light-emitting display apparatus 102 of the second comparative example has a longer average water and vapor transmission path from a defective point to the OLED, even when damages such as cracks occur in the first barrier layer 1BL and/or the second barrier layer 2BL, the occurrence of defective OLEDs may be reduced.

However, the water and vapor transmission power are improved by the flexible substrate FS-2 of the second comparative example improved, and thus, less dark spots occur. However, since an adhesive strength between the first barrier layer 1BL of an inorganic layer and the second plastic layer 2PL of an organic layer is relatively weak, the first barrier layer 1BL and the second plastic layer 2PL are delaminated from each other during manufacturing processes.

However, since the organic light-emitting display apparatus 100 according to an exemplary embodiment of the present invention includes the first barrier layer 1BL patterned to have an island shape, the first plastic layer 1PL and the second plastic layer 2PL are in direct contact in the peripheral area B of the area A corresponding to the organic light-emitting device layer 120 having no first barrier layer 1BL. Since an adhesive strength between the first plastic layer 1PL and the second plastic layer 2PL is greater than that between the first barrier layer 1BL and the second plastic layer 2PL, the delamination between the first barrier layer 1BL and the second plastic layer 2PL may be prevented by patterning the first barrier layer 1BL to have an island shape. Moreover, by forming a patterned area of the first barrier layer 1BL in an area corresponding to the organic light-emitting device layer 120, moisture and oxygen are prevented from penetrating from the first plastic layer 1PL into the organic light-emitting device layer 120 directly.

FIGS. 5A to 11 are views illustrating a method of manufacturing the organic light-emitting display apparatus 100 according to an exemplary embodiment of the present invention.

Figure 5A:
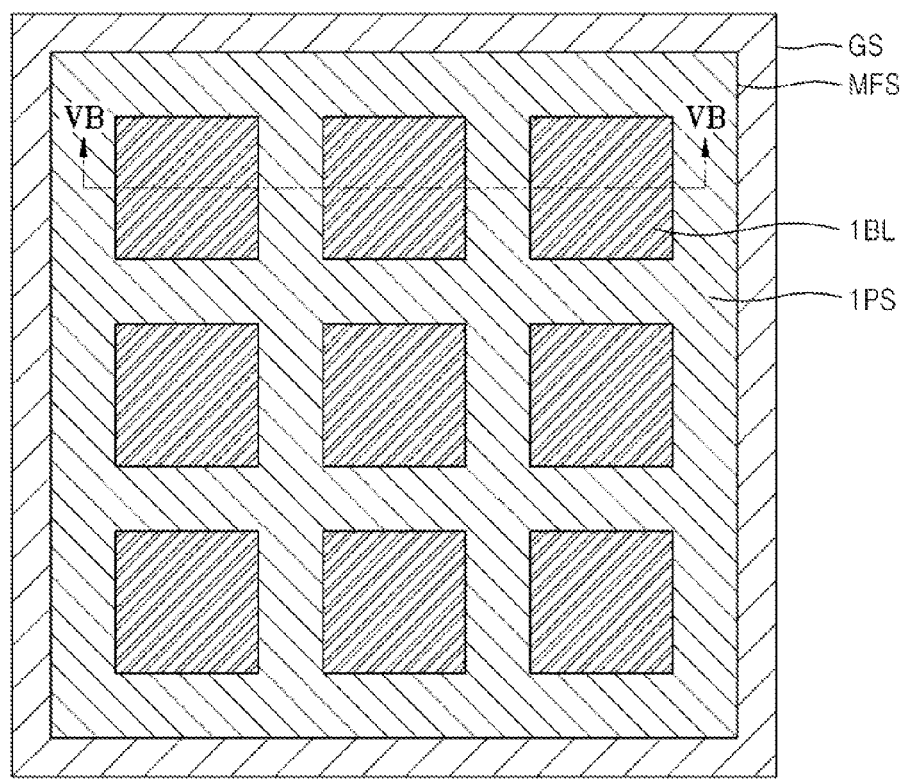
FIG. 5A is a plan view illustrating a process of forming a first plastic layer and a first barrier layer of a mother flexible substrate on a glass substrate.
Figure 5B:
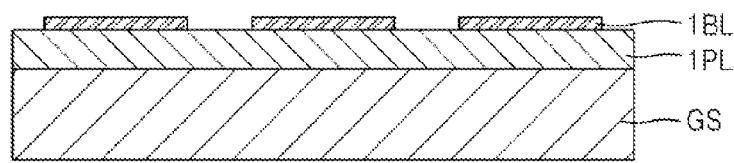
FIG. 5B is a cross-sectional view taken along a line VB-VB of FIG. 5A.

FIG. 5A is a plan view illustrating a process of forming a first plastic layer 1PL and a first barrier layer 1BL of a mother flexible substrate MFS on a glass substrate GS. FIG. 5B is a cross-sectional view taken along a line VB-VB of FIG. 5A.

Since the mother flexible substrate MFS formed of plastic material bends or elongates when heat is applied thereto, it is difficult to accurately form thin film patterns such as various electrodes or conductive wires on the mother flexible substrate MFS. Also, several thin film pattern forming processes are performed when the mother flexible substrate MFS is bonded to the glass substrate GS, for example, a carrier substrate.

First, the first plastic layer 1PL is formed on the glass substrate GS. The first plastic layer 1PL may be formed when a plastic polymer solution including at least one of polyimide, polyethylene naphthalate, PET, Polyarylate, polycarbonate, PEI, and Polyethersulfone is coated on the glass substrate GS and then hardened or a polymer film is laminated on the glass substrate GS.

Then, the first barrier layer 1BL patterned to have an island shape is formed on the first plastic layer 1PL. The first barrier layer 1BL may include a single layer or a multilayer, which are formed of an inorganic material such as AlO3, SiO2, or SiNx through chemical vapor deposition (CVD), plasma enhanced chemical vapor deposition (PECVD) or Atomic Layer Deposition (ALD). At this point, as a method of patterning the first barrier layer 1BL, various methods including a method of depositing on the first plastic layer 1PL a vapor inorganic material passing through a metal mask having a predetermined patterned area and a method of forming the first barrier layer 1BL on all of the first plastic layer 1PL and performing a patterning process through a photolithography process may be used.

Figure 6A:
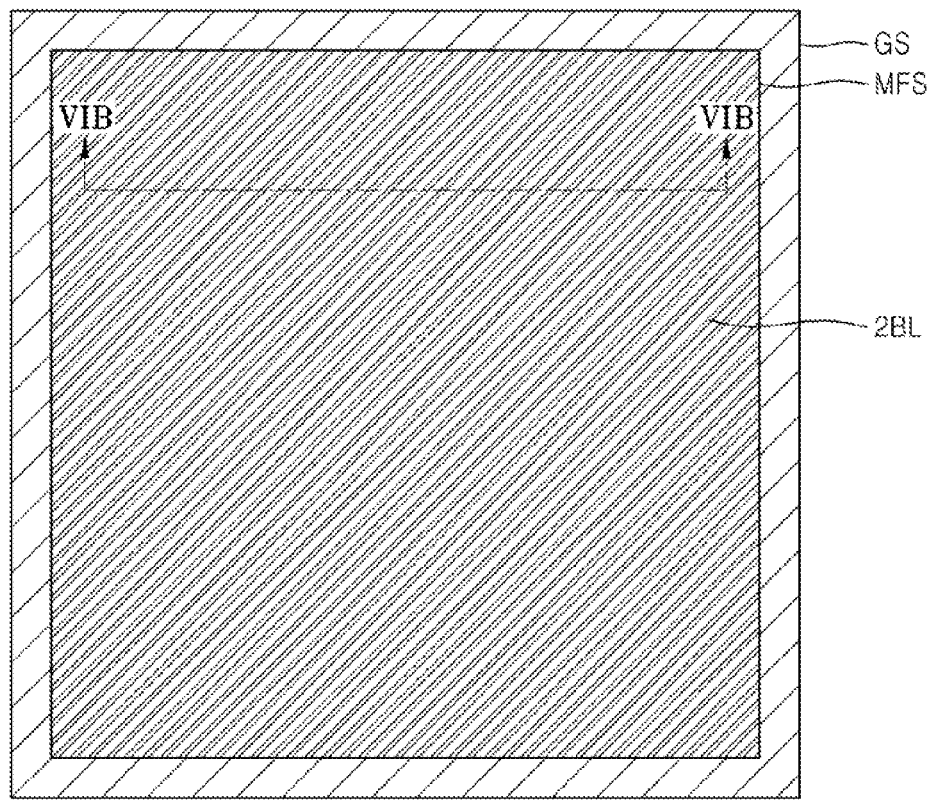
FIG. 6A is a plan view illustrating a process of forming a second plastic layer and a second barrier layer of a mother flexible substrate on a glass substrate.
Figure 6B:
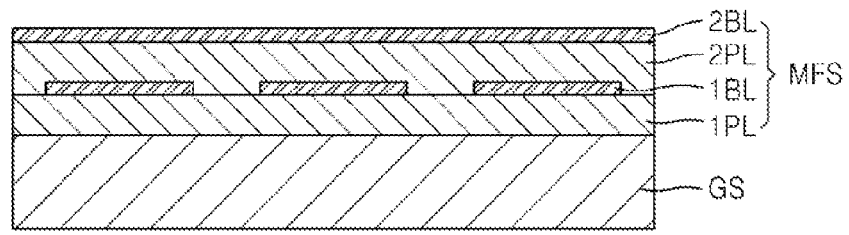
FIG. 6B is a cross-sectional view taken along a line VIB-VIB of FIG. 6A.

FIG. 6A is a plan view illustrating a process of forming a second plastic layer 2PL and a second barrier layer 2BL of a mother flexible substrate MFS on a glass substrate GS. FIG. 6B is a cross-sectional view taken along a line VIB-VIB of FIG. 6A.

Referring to FIGS. 6A and 6B, the second plastic layer 2PL is formed on the first barrier layer 1BL that is patterned. The second plastic layer 2PL may be formed of the same material and by the same method as the first plastic layer 1PL.

The second plastic layer 2PL may alternatively be formed of a solution having lower viscosity than the first plastic layer 1PL. When the first and second plastic layers 1PL and 2PL are formed through coating, since a high viscosity coating solution has a lot of foreign materials, the first and second plastic layers 1PL and 2PL are coated with the foreign materials simultaneously during coating. Accordingly, since the second plastic layer 2PL is formed of a solution having lower viscosity than the first plastic layer 1PL, filtering may be possible during the coating of the second plastic layer 2PL. At this point, since the plastic layer 2PL is formed of a filtered material, the presence of foreign materials in the plastic layer 2PL may be reduced. Also, since a coating liquid used for forming the second plastic layer 2PL has a low concentration, the coating liquid may cover foreign materials occurring in the first plastic layer 1PL and the first barrier layer 1BL.

Moreover, although each of the first plastic layer 1PL and the second plastic layer 2PL has the same thickness as shown in FIGS. 1 and 6B, the present invention is not limited thereto. The transmission time of oxygen and moisture from the outside of the flexible substrate FS is further affected by the thickness of the second plastic layer 2PL that is closer to the organic light-emitting device layer 120 than the first plastic layer 1PL. Accordingly, by forming the thicker second plastic layer 2PL that is closer to the organic light-emitting device layer 120 than the first plastic layer, the water and vapor transmission time is delayed so that the deterioration of the OLED may be prevented.

Then, the second barrier layer 2BL is formed on the second plastic layer 2PL. The second barrier layer 2BL may be formed of the same material and by the same method as the first barrier layer 1BL.

Figure 7A:
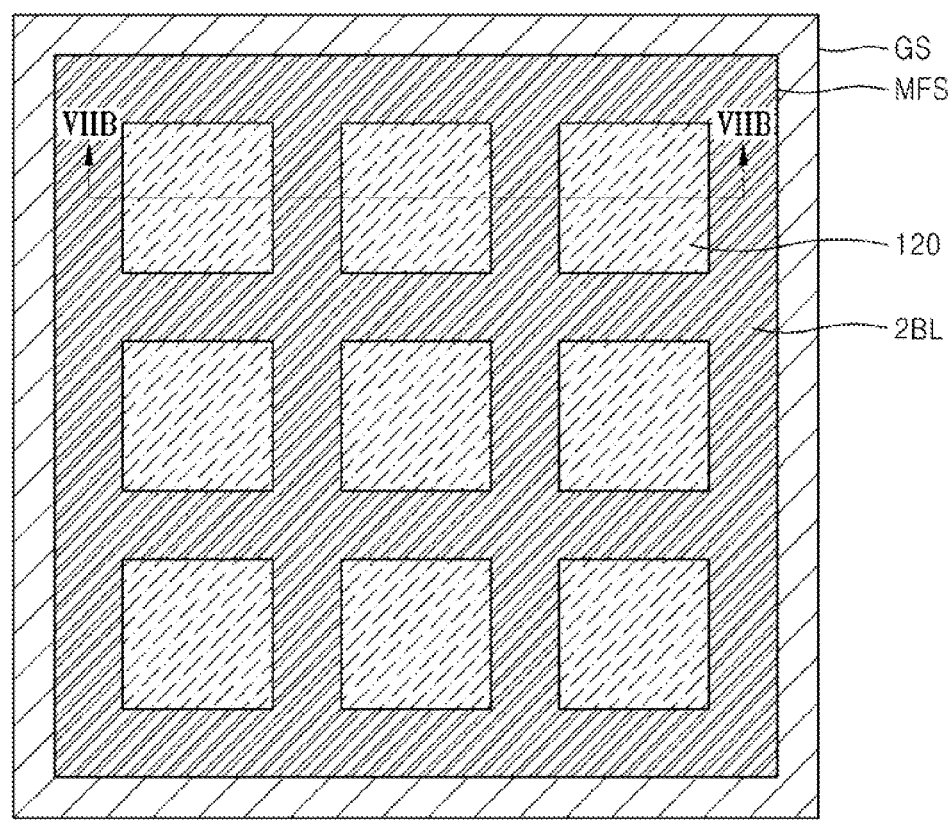
FIG. 7A is a plan view illustrating a process of forming a plurality of unit organic light-emitting display apparatus on a mother flexible substrate.
Figure 7B:
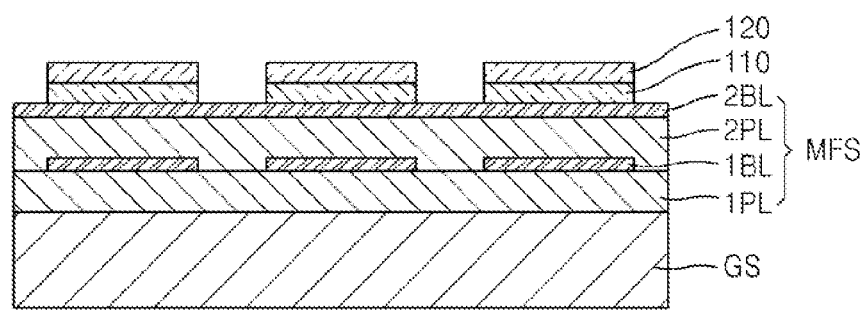
FIG. 7B is a cross-sectional view taken along a line VIIB-VIIB of FIG. 7A.

FIG. 7A is a plan view illustrating a process of forming a plurality of unit organic light-emitting display apparatus 100 on a mother flexible substrate MFS. FIG. 7B is a cross-sectional view taken along a line VIIB-VIIB of FIG. 7A.

Referring to FIGS. 7A and 7B, the plurality of unit organic light-emitting display apparatus 100 including a TFT layer 110 and an organic light-emitting device layer 120 are formed on the mother flexible substrate MFS.

Various methods may be used to form the semiconductor layer 111 of FIG. 2 on which the TFT layer 110 is formed. For example, when crystalline silicon, amorphous silicon, or conductive oxide is used for forming the semiconductor layer 111 of FIG. 2, the plurality of unit organic light-emitting display apparatus 100 may be formed through a deposition method such as a PECV method, an atmospheric pressure CVD (APCVD), or a lower pressure CVD (LPCVD). When an organic TFT is formed on the semiconductor layer 111 of FIG. 2, the plurality of unit organic light-emitting display apparatus 100 may be formed a method such as coating or printing. Moreover, when polycrystalline silicon is used for forming the semiconductor layer 111 of FIG. 2, amorphous silicon may be crystallized by applying various crystallization methods such as rapid thermal annealing (RTA), solid phase crystallization (SPC), excimer laser annealing (ELA), metal induced crystallization (MIC), metal induced lateral crystallization (MILC), and sequential lateral solidification (SLS).

The gate electrode 113 of FIG. 2, the source electrode 115 of FIG. 2, the drain electrode 116 of FIG. 2, a capacitor (not shown), and various wires (not shown) are deposited on the TFT layer 110 through a method such as CVD, PECVD, or ALD, and then, a desired pattern is formed through a photolithography process.

The layer 123 of FIG. 2 including an organic light-emitting material of the organic light-emitting device layer 120 may be formed through various methods such as a deposition method, a coating method, a printing method, and an optical-thermal transfer method.

Moreover, although not shown in FIG. 7B, a buffer layer (not shown) may be further provided between the second barrier layer 2BL and the TFT layer 110.

Figure 8:
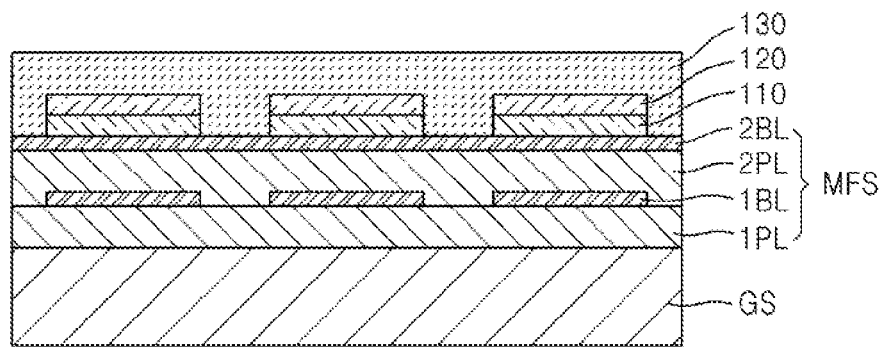
FIG. 8 is a cross-sectional view illustrating a process of forming a thin film encapsulating layer encapsulating a plurality of organic light-emitting device layers on a mother flexible substrate.

FIG. 8 is a cross-sectional view illustrating a process of forming a thin film encapsulating layer 130 encapsulating a plurality of organic light-emitting device layers 120 on the mother flexible substrate MFS.

As mentioned above, the thin film encapsulating layer 130 may be formed of a plurality of inorganic layers or a mixture of an inorganic layer and an organic layer. The inorganic layer and the organic layer may be formed through various methods such as CVD, PECVD, and sputtering.

Moreover, although one thin film encapsulating layer 130 is commonly covers the plurality of unit organic light-emitting display apparatus 100 overall as shown in FIG. 8, the present invention is not limited thereto. That is, the thin film encapsulating layer 130 may be discontinuously formed to separately cover each unit organic light-emitting device of the organic light-emitting display apparatus 100.

Figure 9:
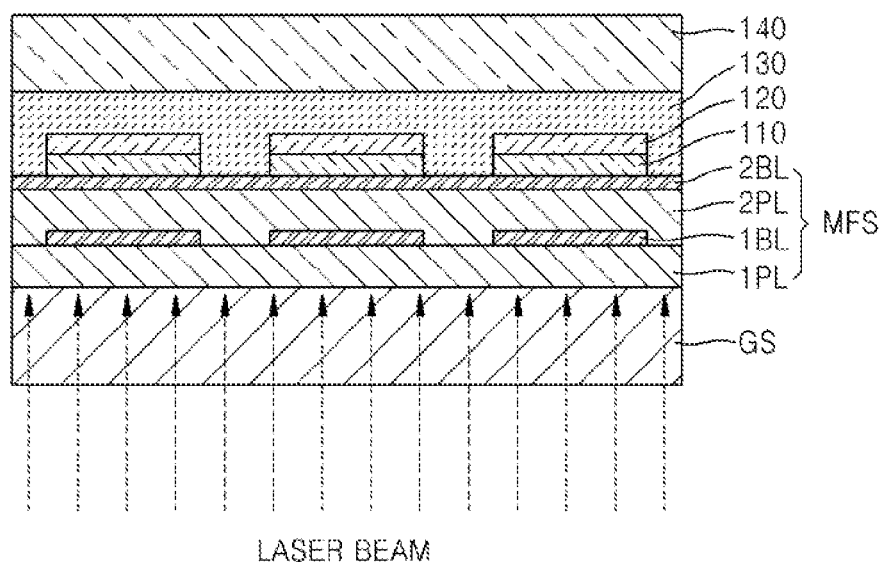
FIGS. 9 and 10 are cross-sectional views illustrating a process of separating a glass substrate from a mother flexible substrate.
Figure 10:
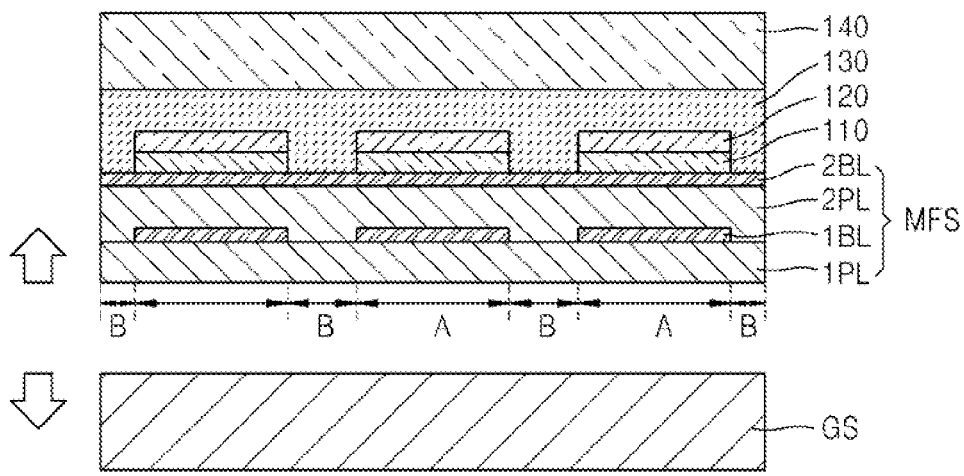

FIGS. 9 and 10 are cross-sectional views illustrating a process of separating a glass substrate GS from a mother flexible substrate MFS.

Referring to FIG. 9, in order to separate the mother flexible substrate MFS from the glass substrate GS, a laser beam is radiated from an opposite direction of a side where the mother flexible substrate MFS is formed.

The laser beam may an UV light radiated by using an Excimer laser device. The radiated UV light passes through the glass substrate GS and is absorbed by the first plastic layer 1PL and the second plastic layer 2PL. An adhesive strength between the first plastic layer 1PL and the second plastic layer 2PL becomes weaker due to the absorbed energy. The second barrier layer 2BL is easily broken by external tension. Accordingly, by properly applying an external tension in an arrow direction of FIG. 10 to the mother flexible substrate MFS and the glass substrate GS, the mother flexible substrate MFS may be separated from the glass substrate GS.

However, since an adhesive strength between the first barrier layer 1BL of an inorganic layer and the second plastic layer 2PL of an organic layer is relatively weak during a process of separating the mother flexible substrate MFS from the glass substrate GS, the first barrier layer 1BL and the second plastic layer 2PL are delaminated from each other during manufacturing processes. However, since the first barrier layer 1BL may be patterned to have an island shape only in an area A corresponding to the organic light-emitting device layer 120, the first plastic layer 1PL and the second plastic layer 2PL are in direct contact in the peripheral area B of the area A corresponding to the organic light-emitting device layer 120 having no first barrier layer 1BL. Since an adhesive strength between the first plastic layer 1PL and the second plastic layer 2PL is greater than that between the first barrier layer 1BL and the second plastic layer 2PL, the delamination between the first barrier layer 1BL and the second plastic layer 2PL may be prevented.

Moreover, a first protective film 140 may be attached on the thin film encapsulating layer 130 prior to a process of separating the mother flexible substrate MFS from the glass substrate GS. The first protective film 140 may be used as an optical member such as a polarizing film.

Figure 11:
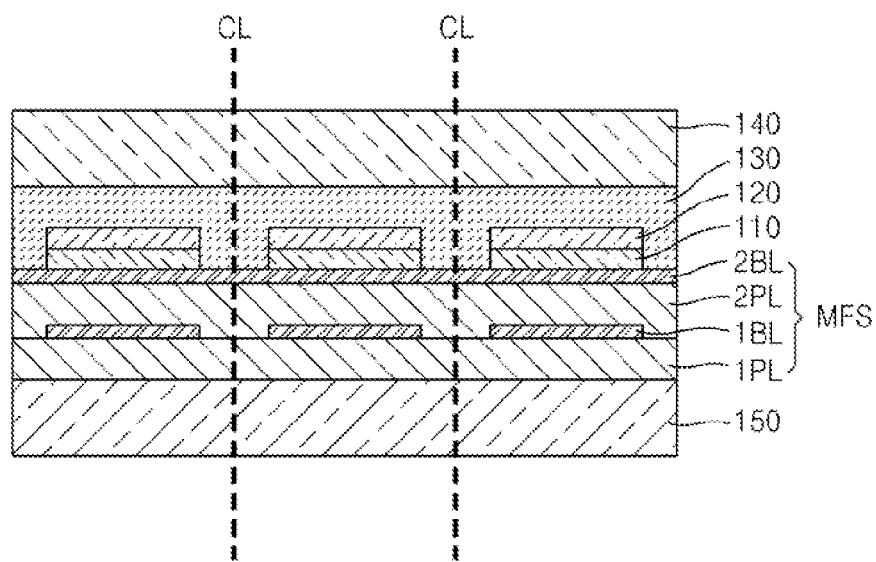
FIG. 11 is a cross-sectional view illustrating a process of dividing an organic light-emitting device layer on a mother flexible substrate into a plurality of unit display devices.

FIG. 11 is a cross-sectional view illustrating a process of dividing an organic light-emitting device layer on a mother flexible substrate MFS into a plurality of unit display devices 100.

After the mother flexible substrate MFS is separated from the glass substrate GS and a second protective film 150 is attached to the other side of the mother flexible substrate MFS, a process of dividing the mother flexible substrate MFS into a plurality of unit display devices 100 may be performed. The second protective film 150 may be used as an optical member such as a polarizing film.

By cutting the mother flexible substrate MFS along a cutting line CL of a non-display area between unit display devices by using a cutting wheel and a laser cutting device, an organic light-emitting device layer formed on the mother flexible substrate MFS may be divided into a plurality of unit display devices 100.

A method of manufacturing a mother flexible substrate MFS-2 of an organic light-emitting display apparatus 102 according to a comparative example of the present invention will be described with reference to FIGS. 12A and 12B.

Figure 12A:
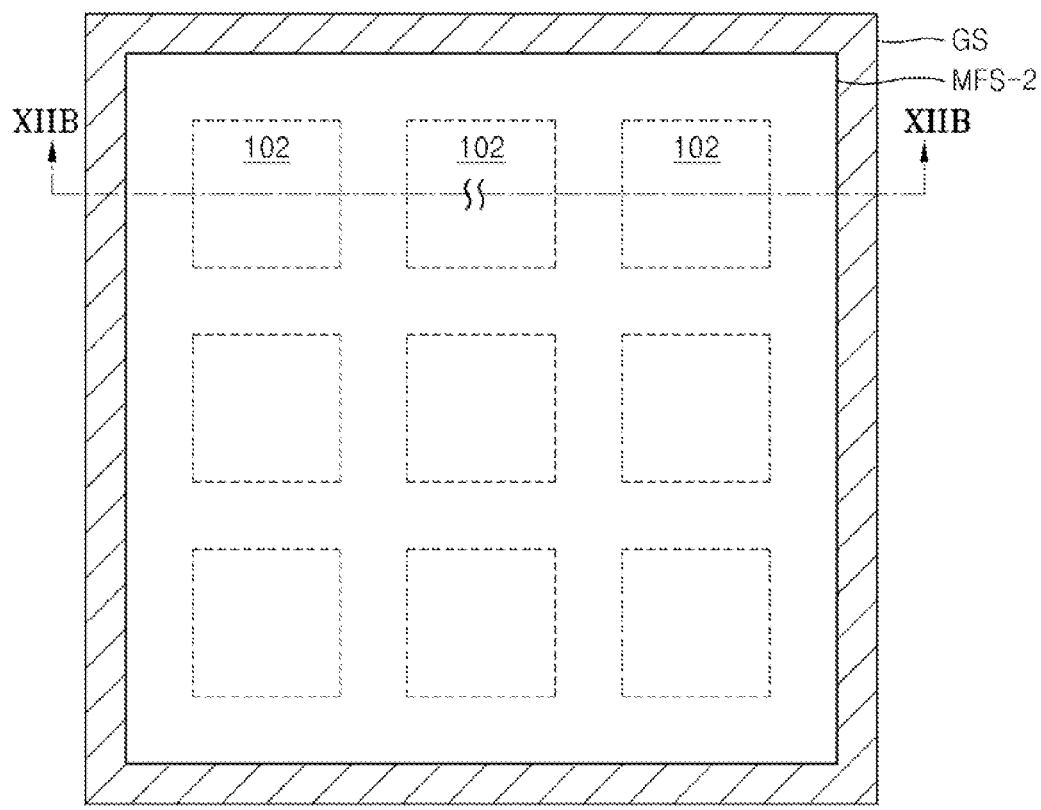
FIG. 12A is a plan view illustrating a process of forming a mother flexible substrate on a glass substrate.
Figure 12B:
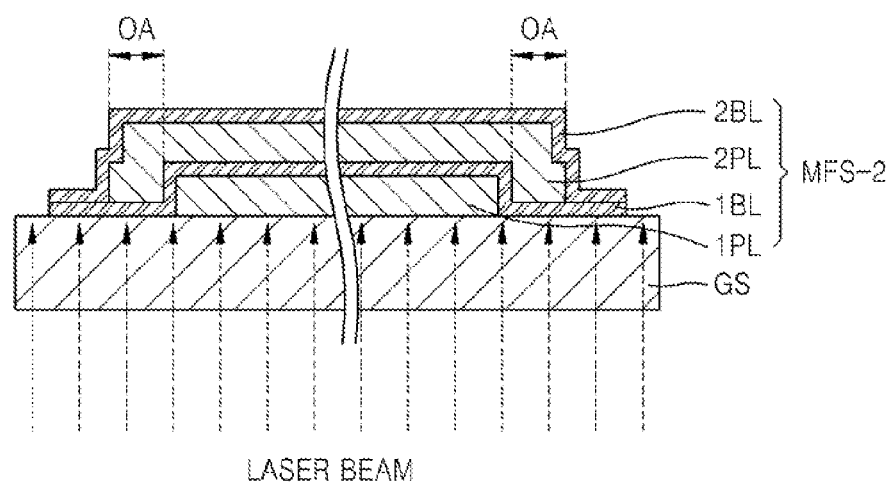
FIG. 12B is a cross-sectional view taken along a line VIIB-VIIB of FIG. 12A.

FIG. 12A is a plan view illustrating a process of forming a mother flexible substrate MFS-2 on a glass substrate GS. FIG. 12B is a cross-sectional view taken along a line VIIB-VIIB of FIG. 12A. FIGS. 12A and 12B also illustrate an outer part of a contact surface of the glass substrate GS and the mother flexible substrate MFS-2.

The first plastic layer 1PL and the second plastic layer 2PL on the glass substrate GS are covered by the first barrier layer 1BL and the second barrier layer 2BL, respectively. The first barrier layer 1BL is not patterned.

When the first plastic layer 1PL and the second plastic layer 2PL are formed on the glass substrate GS through a coating process, if a coating liquid flows to the outside of the glass substrate GS, defects occur. Accordingly, the first plastic layer 1PL and the second plastic layer 2PL may be coated in a smaller area than the glass substrate GS. Alternatively, since the first barrier layer 1BL and the second barrier layer 2BL are formed through a deposition process such as CVD or PECVE, they are closer to an end part of the glass substrate GS than the first plastic layer 1PL and the second plastic layer 2PL.

The second plastic layer 2PL covers a portion of the first plastic layer 1PL. Accordingly, even when the second plastic layer 2PL and the first plastic layer 1PL are formed at the same position, and the second plastic layer 2PL flows to the outer part of the first plastic layer 1PL due to a flowing coating liquid. An area OA where a first barrier layer 1BL-1 and a second plastic layer 2PL overlap is formed in an outer part of the mother flexible substrate MFS-2.

During a separation process of the mother flexible substrate MFS-2 and the glass substrate GS, a radiated UV light passes through the glass substrate GS and is absorbed by the first plastic layer 1PL and the second plastic layer 2PL. However, since the first barrier layer 1BL absorbs the UV light in the area OA where the first barrier layer 1BL and the second plastic layer 2PL overlap, the UV light is not absorbed by the second plastic layer 2PL. Thus, it is difficult to separate the mother flexible substrate MFS-2 from the glass substrate GS.

Figure 13:
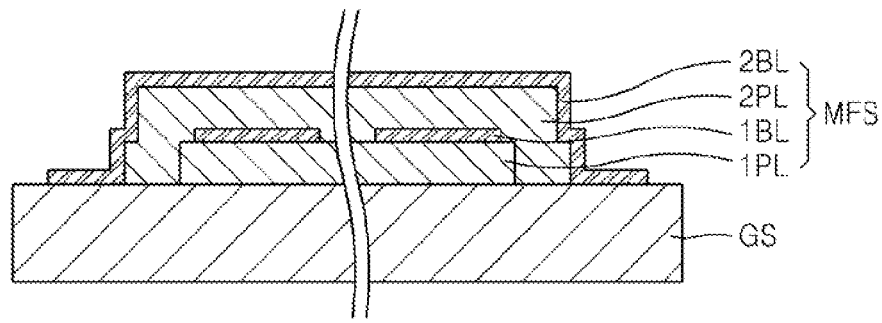
FIG. 13 is a detailed view illustrating an outer part of a contact surface of a glass substrate and a mother flexible substrate.

FIG. 13 is a detailed view illustrating an outer part of a contact surface of the glass substrate GS and the mother flexible substrate MFS.

Here, since the first barrier layer 1BL is not formed in an outer part of the glass substrate GS, an area OA where the first barrier layer 1BL and the second plastic layer 2PL overlap is not formed in an outer part of the mother flexible substrate MFS. Thus, an end part of the second plastic layer 2PL and an end part of the first barrier layer 1BL are in direct contact at an end part of the glass substrate GS. Accordingly, a separation process of the mother flexible substrate MFS and the glass substrate GS is performed smoothly.

Hereinafter, a method of manufacturing the organic light-emitting display apparatus 100 according to an exemplary embodiment of the present invention will be described with reference to FIGS. 14 and 15.

Figure 14:
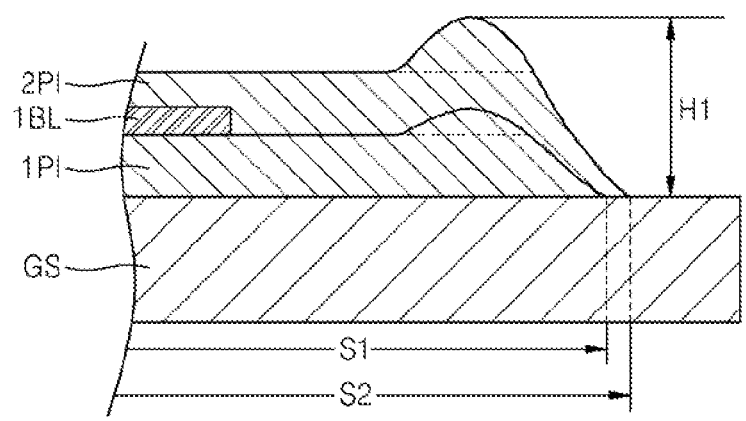
FIG. 14 is a cross-sectional view illustrating an end part of a glass substrate when a second plastic layer is greater than a first plastic layer.
Figure 15:
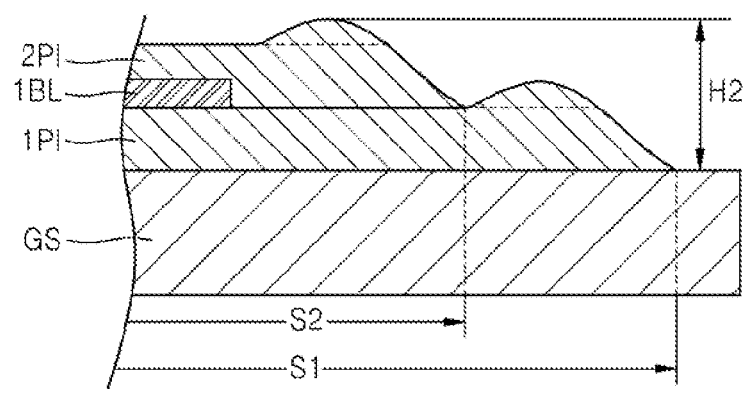
FIG. 15 is a cross-sectional view illustrating an end part of a glass substrate when a second plastic layer is smaller than a first plastic layer.

FIG. 14 is a cross-sectional view illustrating an end part of a glass substrate when the second plastic layer 2PL is greater than the first plastic layer 1PL. FIG. 15 is a cross-sectional view illustrating an end part of a glass substrate when the second plastic layer 2PL is smaller than the first plastic layer 1PL. In the above two cases, the first barrier layer 1BL is patterned.

When the first plastic layer 1PL is coated on the glass substrate, a coffee ring phenomenon occurs when an end part of the first plastic layer 1PL protrudes convexly. As shown in FIG. 14, if the second plastic layer 2PL is coated on the first plastic layer, due to the amplified coffee ring phenomenon, the height H of the entire coffee ring rises from the top surface of the glass substrate in the second plastic layer. However, when the second plastic layer 2PL is formed to have a smaller area than the first plastic layer 1PL as shown in FIG. 15, the coffee ring generated by the second plastic layer 2PL is not amplified. Therefore, the height H2 of the entire coffee ring becomes smaller compared to that in FIG. 14.

Due to the coffee ring phenomenon, a film remains at a portion including an align key necessary for a photolithography process that is to be performed on the mother flexible substrate, so that misalignment may occur during a subsequent process. However, this may be prevented when the second plastic layer 2PL is formed to be equal to or smaller than the first plastic layer.

Since the second plastic layer 2PL flows on the first plastic layer 1PL during a coating process, an area of the second plastic layer 2PL is smaller than designed.

Figure 16:
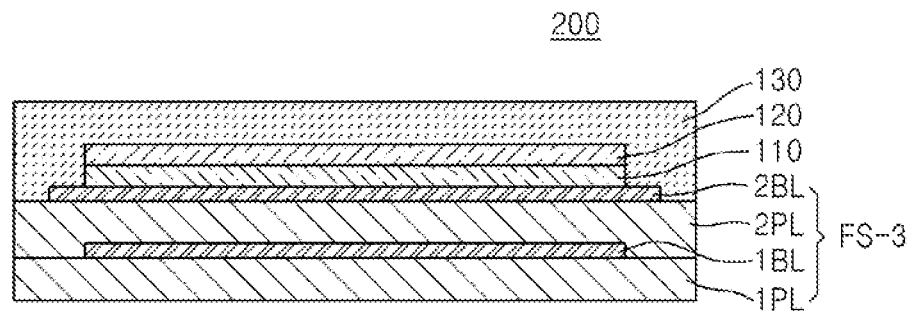
FIG. 16 is a cross-sectional view illustrating an organic light-emitting display apparatus according to an exemplary embodiment of the present invention.

FIG. 16 is a cross-sectional view illustrating an organic light-emitting display apparatus 200 according to an exemplary embodiment of the present invention.

Referring to FIG. 16, the organic light-emitting display apparatus 200 includes a flexible substrate FS-3, a TFT layer 110, an organic light-emitting device layer 120, and a thin film encapsulating layer 130. Hereinafter, differences between the organic light-emitting display apparatus 100 described above will be mainly described. Like reference numerals in the first and second embodiments may refer to like elements. A flexible substrate FS-3 of the organic light-emitting display apparatus 200 includes a first plastic layer 1PL, a first barrier layer 1BL, a second plastic layer 2PL, and a second barrier layer 2BL.

The first barrier layer 1BL and the second barrier layer 2BL are patterned to be disposed in an area where the organic light-emitting device layer 120 is formed.

Figure 17:
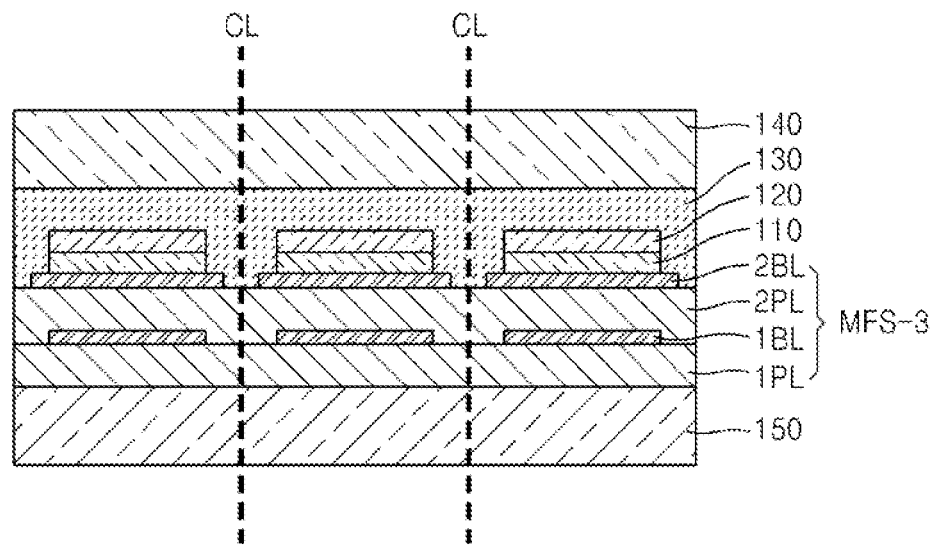
FIG. 17 is a cross-sectional view illustrating a manufacturing process of an organic light-emitting display apparatus according to an embodiment of the present invention.

FIG. 17 is a cross-sectional view illustrating a process of manufacturing an organic light-emitting display apparatus 200 according to an exemplary embodiment of the present invention.

FIG. 17 is a cross-sectional view illustrating a process of forming a mother flexible substrate MFS-3 on a glass substrate GS.

Referring to FIG. 17, a first barrier layer 1BL, which is patterned, a second plastic layer 2PL, and a second barrier layer 2BL, which is patterned, are formed on a first plastic layer 1PL of the glass substrate GS.

At this point, the first barrier layer 1BL and the second barrier layer 2BL are formed only in an area corresponding to each unit display device 200, and are not formed in a non-display area between the unit display devices 200. Accordingly, during a process of dividing a plurality of organic light-emitting device layers on the mother flexible substrate MFS-3 into a plurality of unit display devices 200, an inorganic layer such as the first barrier layer 1BL and the second barrier layer 2BL is formed smaller along a cutting line CL, so that cracks or pollutants due to the inorganic layer may be reduced during a cutting process.

Additionally, since the first barrier layer 1BL and the second barrier layer 2BL are not formed at an end part of the glass substrate GS, an area where the first barrier layer 1BL and the second plastic layer 2PL overlap is not formed at an end part of the glass substrate GS. For example, an end part of the second plastic layer 2PL and an end part of the first barrier layer 1BL are in direct contact at an end part of the glass substrate GS. Accordingly, a separation process of the mother flexible substrate MFS-3 and the glass substrate GS is performed smoothly.

Moreover, although an area of the second barrier layer 2BL is larger than that of the first barrier layer 1BL as shown in FIGS. 16 and 17, the present invention is not limited thereto. Thus, the area of the second barrier layer 2BL may be equal to or less than that of the first barrier layer 1BL.

Figure 18:
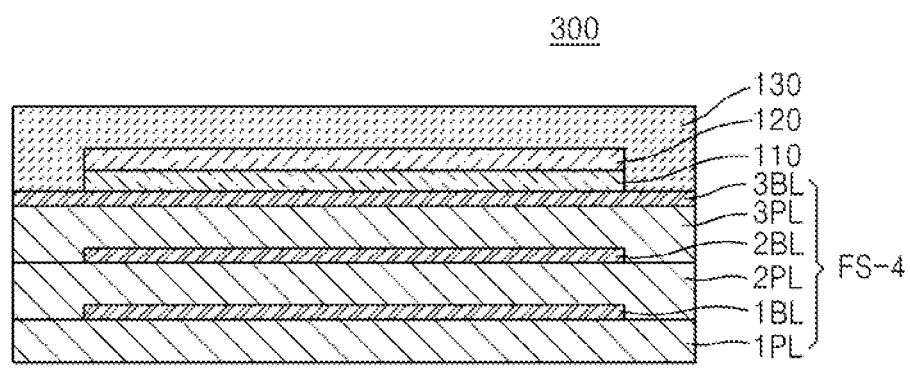
FIG. 18 is a cross-sectional view illustrating an organic light-emitting display apparatus according to an exemplary embodiment of the present invention.

FIG. 18 is a cross-sectional view illustrating an organic light-emitting display apparatus 300 according to an exemplary embodiment of the present invention.

Referring to FIG. 16, the organic light-emitting display apparatus 300 includes a flexible substrate FS-4, a TFT layer 110, an organic light-emitting device layer 120, and a thin film encapsulating layer 130. Hereinafter, a difference from the organic light-emitting display apparatus 100 described above will be mainly described. Like reference numerals may refer to like elements.

A flexible substrate FS-4 of the organic light-emitting display apparatus 300 may include a first plastic layer 1PL, a first barrier layer 1BL, a second plastic layer 2PL, a second barrier layer 2BL, a third plastic layer 3PL, and a third barrier layer 3BL.

For example, regarding the organic light-emitting display apparatus 300, since the flexible substrate FS-3 includes three alternately-stacked plastic layers and three barrier layers, an average water and vapor transmission path becomes longer compared to the organic light-emitting display apparatus 100 discussed above, so that the transmission of oxygen and moisture may be further prevented.

Additionally, since the first barrier layer 1BL and the second plastic layer 2PL are patterned, the delamination between the first barrier layer 1BL and the second plastic layer 2PL and between the second barrier layer 2BL and the third plastic layer 3PL may be prevented.

Moreover, although a structure including alternately-stacked three plastic layers and three barrier layers is shown in FIG. 18, a plastic layer and a barrier layer may be further stacked where desired.

Moreover, although a structure of an organic light-emitting display apparatus is described in the above embodiments, the present invention may also be applied to various flexible display devices in addition to an organic light-emitting display apparatus. For example, the present invention may be applied to various electronic devices such as a portable mobile device, a navigation system, a video camera, a notebook PC, a tablet PC, a flat screen TV, and a beam projector.

According to an exemplary embodiment of the present invention, since a flexible substrate includes two plastic layers and two barrier layers which are alternately stacked, an average vapor transmission path becomes longer, thereby preventing the deterioration of an OLED.

Additionally, by patterning a barrier layer adjacent to a plastic layer, the two plastic layers are in direct contact in a region where the barrier layer is patterned, so that the delamination between the barrier layer and the two plastic layers may be prevented.

While the present invention has been particularly shown and described with reference to exemplary embodiments thereof, it will be understood by those of ordinary skill in the art that various changes in form and details may be made therein without departing from the spirit and scope of the present invention.

What is claimed is:

1. An organic light-emitting display apparatus comprising:
a first flexible plastic layer;
a first barrier layer formed on the first flexible plastic layer, the first barrier layer being substantially impervious to water and oxygen;
a second flexible plastic layer formed on the first barrier layer;
an organic light-emitting device layer formed on the second flexible plastic layer; and
a thin film encapsulating layer encapsulating the organic light-emitting device layer, wherein the first barrier layer is patterned to correspond to an area where the organic light-emitting device layer is formed and the first flexible plastic layer is in contact with the second flexible plastic layer in an area that surrounds the first barrier layer.

2. The organic light-emitting display apparatus of claim 1, wherein the first flexible plastic layer is in contact with the second flexible plastic layer in an outer part of an area where the organic light-emitting device layer is formed.

3. The organic light-emitting display apparatus of claim 1, further comprising a second barrier layer, substantially impervious to water and oxygen, between the second flexible plastic layer and the organic light-emitting device layer.

4. The organic light-emitting display apparatus of claim 3, wherein the second barrier layer comprises at least one layer including an inorganic material.

5. The organic light-emitting display apparatus of claim 3, wherein the second barrier layer is patterned to be located in an area where the organic light-emitting device layer is formed.

6. The organic light-emitting display apparatus of claim 5, wherein the second barrier layer is in contact with the thin film encapsulating layer in an outer part of an area where the organic light-emitting device layer is formed.

7. The organic light-emitting display apparatus of claim 3, wherein at least one pair of layers, each layer including a third flexible plastic layer and a third barrier layer, substantially impervious to water and oxygen, is formed between the second barrier layer and the organic light-emitting device layer.

8. The organic light-emitting display apparatus of claim 7, wherein the second barrier layer is patterned to be located in an area where the organic light-emitting device layer is formed.

9. The organic light-emitting display apparatus of claim 1, wherein the first plastic flexible layer and the second plastic flexible layer comprise polyiminde, polyethylene naphthalate, polyethyleneterephthalate, polyarylate, polycarbonate, polyethersulfone, or polyetherimide.

10. The organic light-emitting display apparatus of claim 1, wherein a thickness of the second plastic flexible layer is larger than that of the first plastic flexible layer.

11. The organic light-emitting display apparatus of claim 1, wherein the second plastic flexible layer has a lower viscosity than the first plastic flexible layer.

12. The organic light-emitting display apparatus of claim 1, wherein the first barrier layer comprises at least one layer including an inorganic material.

13. An electronic device including the organic light-emitting display apparatus of claim 1.

* * * * *